United States Patent [19]

Fletcher

[11] Patent Number: 4,490,230

[45] Date of Patent: Dec. 25, 1984

[54] ELECTROPLATING APPARATUS

[75] Inventor: Ivan M. Fletcher, Carmel, Ind.

[73] Assignee: AT&T Technologies, Inc., New York, N.Y.

[21] Appl. No.: 474,061

[22] Filed: Mar. 10, 1983

[51] Int. Cl.³ .................... C25D 17/00; C25D 5/18
[52] U.S. Cl. .................... 204/228; 204/267; 204/DIG. 7
[58] Field of Search ............ 204/228, DIG. 7, 267, 204/268, 269, 270, 229, 230, 231

[56] References Cited

U.S. PATENT DOCUMENTS

| | | | |
|---|---|---|---|
| 1,527,095 | 2/1925 | Turnock | 204/228 |
| 2,181,490 | 11/1939 | Lowe | 204/228 X |
| 3,470,082 | 9/1969 | Raymond et al. | 204/228 |
| 3,525,677 | 8/1970 | Austen | 204/43 |
| 3,592,754 | 7/1971 | Aihara | 204/228 |
| 3,717,568 | 2/1973 | Brown et al. | 204/228 |
| 3,824,176 | 7/1974 | Crowe | 204/297 R |
| 4,424,105 | 1/1984 | Hanson | 204/228 |

FOREIGN PATENT DOCUMENTS

| | | | |
|---|---|---|---|
| 53-77879 | 7/1978 | Japan | 204/228 |
| 54-61080 | 5/1979 | Japan | 204/228 |

Primary Examiner—Howard S. Williams
Assistant Examiner—T. L. Williams
Attorney, Agent, or Firm—R. F. Kip, Jr.

[57] ABSTRACT

There is disclosed electroplating apparatus in which a plurality of anodes and a twice-as-large plurality of first and second cathodes are disposed in a cell such that each anode has on its opposite sides a first cathode and a second cathode, respectively. First and second adjustable constant current sources supply current to, respectively, all first cathodes and such anodes and all second cathodes and such anodes. A plurality of current adjusting units respective corresponding to the anodes are connected on the anodic side of each such current source between that source and each respective anode. The anodes are permanently installed in the cell, while the cathodes are carried by a holder fitting over the top of the cell and removable therefrom. The cathodes may be selectively inserted into guideways in their holder and then locked in place in these guideways until removal of the cathodes is desired, when they are unlocked.

7 Claims, 9 Drawing Figures 4,490,230

ELECTROPLATING APPARATUS

TECHNICAL FIELD

This invention relates generally to the art of electroplating, and, more particularly, to that type of electroplating known as box plating.

BACKGROUND OF THE INVENTION

In various gold plating processes, one or more substrates to be gold plated are mounted in an elecroplating cell in spaced relationship with one or more anodes. A liquid electrolyte is circulated between the cathode(s) and anode(s), an electropotential is applied between the cathode(s) and anode(s) and gold is plated out of the liquid electrolyte into selected areas of the cathode(s). The amount of gold being plated in any particular selected area is dependent upon the current density in that area.

While such gold plating can be effected in a cell in which is mounted only one anode and only one cathode, it is more cost efficient to use the technique known as box plating in which a plurality of cathode articles are simultaneously plated in the same cell. The employment of box plating creates, however, the problem of nonuniform plating of the several cathode substrates. Various proposals to alleviate this problem have been made. Thus, for example, U.S. Pat. No. 3,470,082 issued Sept. 30, 1969 in the name of Raymond et al, and incorporated herein by reference, discloses a box plating apparatus in which there is provided for the plurality of cathodes a respectively corresponding plurality of direct current sources which are mutually independent and electrically isolated from each other, and of which each is connected to the cathode respective thereto such that the current through that cathode can be individually controlled by adjustment of an associated potentiometer without affecting the current through the other cathodes. The Raymond et al. system has, however, the disadvantage that the number of separate current sources required must equal the number of cathodes, and so may become large in number and thereby expensive if the number of cathodes is large. Another disadvantage, without restriction, of the Raymond et al. system is that the device for adjusting the current through each cathode is connected to the current source therefor on the cathode side thereof. Moreover, Raymond et al. fail to disclose a system for providing cathode current control in the instance where the box plating apparatus employs a plurality of anodes and a twice-as-large plurality of cathodes of which a pair thereof are disposed on opposite sides of each anode.

SUMMARY OF THE INVENTION

In contrast to the foregoing, a box plating system according to the invention in one of its aspects comprises: a common direct current source for a plurality of cathodes and a plurality of current adjusting units respectively corresponding to such cathodes and each connected in the series circuit including (a) that unit, (b) the cathode respective to that unit, (c) the anode associated with that cathode, (d) the common current source and (e) the electrolyte, each such current adjusting unit being adapted to adjust the current passing therethrough.

According to the invention in another of its aspects, the current adjusting units are connected in the cathode-anode-current source circuits on the positive side of the current source(s). As still another aspect of the invention the plurality of cathodes are divided into pairs of first and second cathodes of which each pair of first and second cathodes are in circuit with and on opposite sides of an anode respective to that pair, which anode is one of a plurality of anodes, and there are first and second direct current sources which furnish current for, respectively, all of said first cathodes and all of said second cathodes.

A further aspect of the invention is that the electroplating apparatus comprises an electroplating chamber in which the anodes are permanently installed and, also, a removable fixture which may be placed over the chamber, and which carries the cathodes.

BRIEF DESCRIPTION OF THE DRAWINGS

For a better understanding of the invention, reference is made to the following description of an exemplary embodiment thereof, and to the accompanying drawings wherein.

DESCRIPTION OF EMBODIMENT

Figure 1:
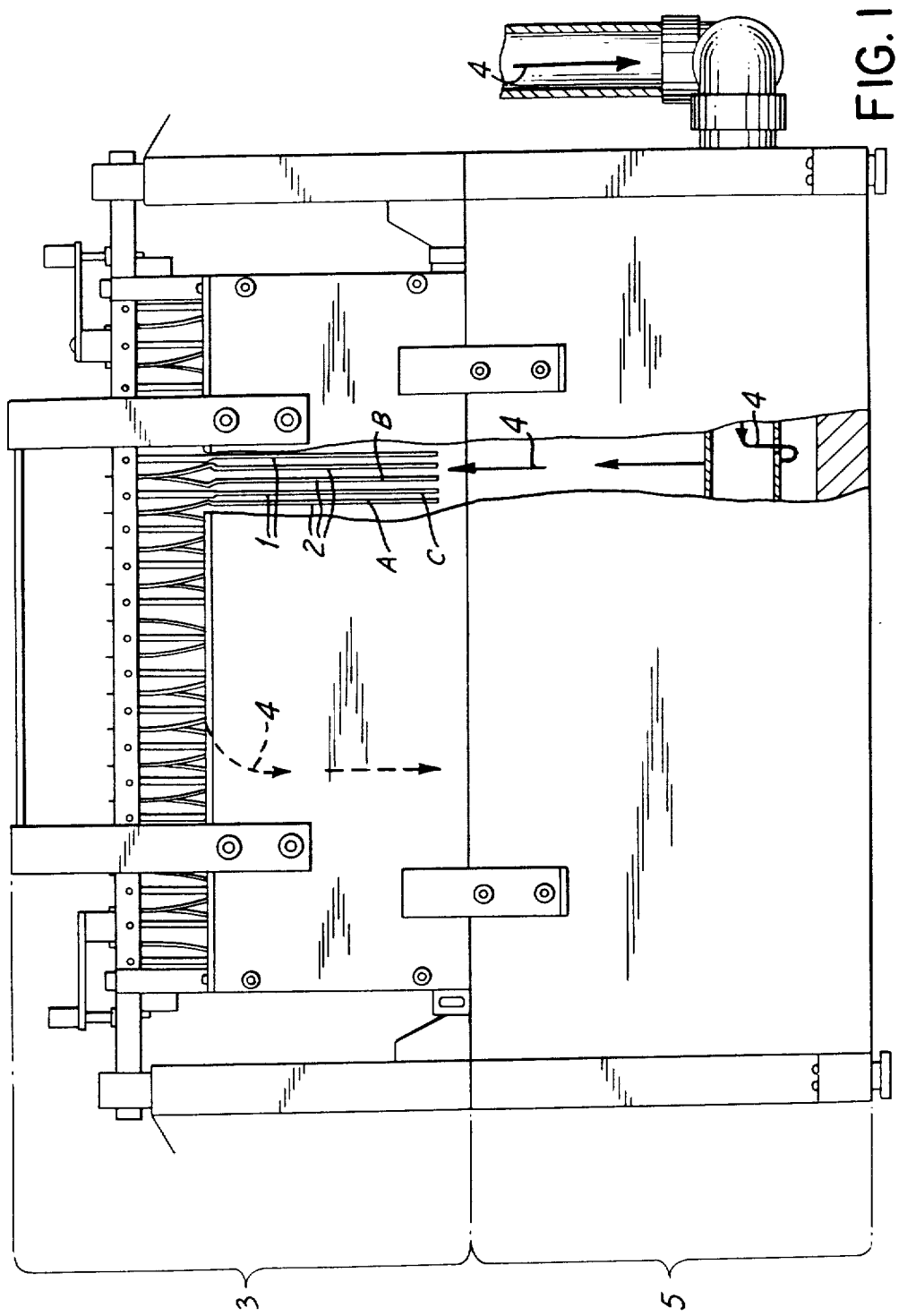
FIG. 1 is a front elevation of an electroplating apparatus utilizing an earlier version of a current control system, parts of the apparatus being cut away to show better the interior thereof.
Figure 2:
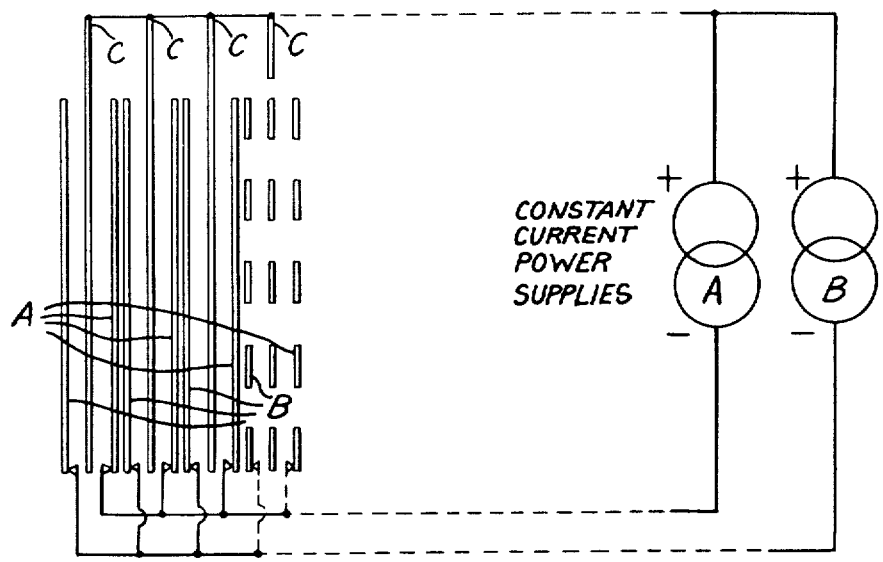
FIG. 2 is a schematic diagram of the earlier version of the current control system of the FIG. 1 apparatus.
Figure 3:
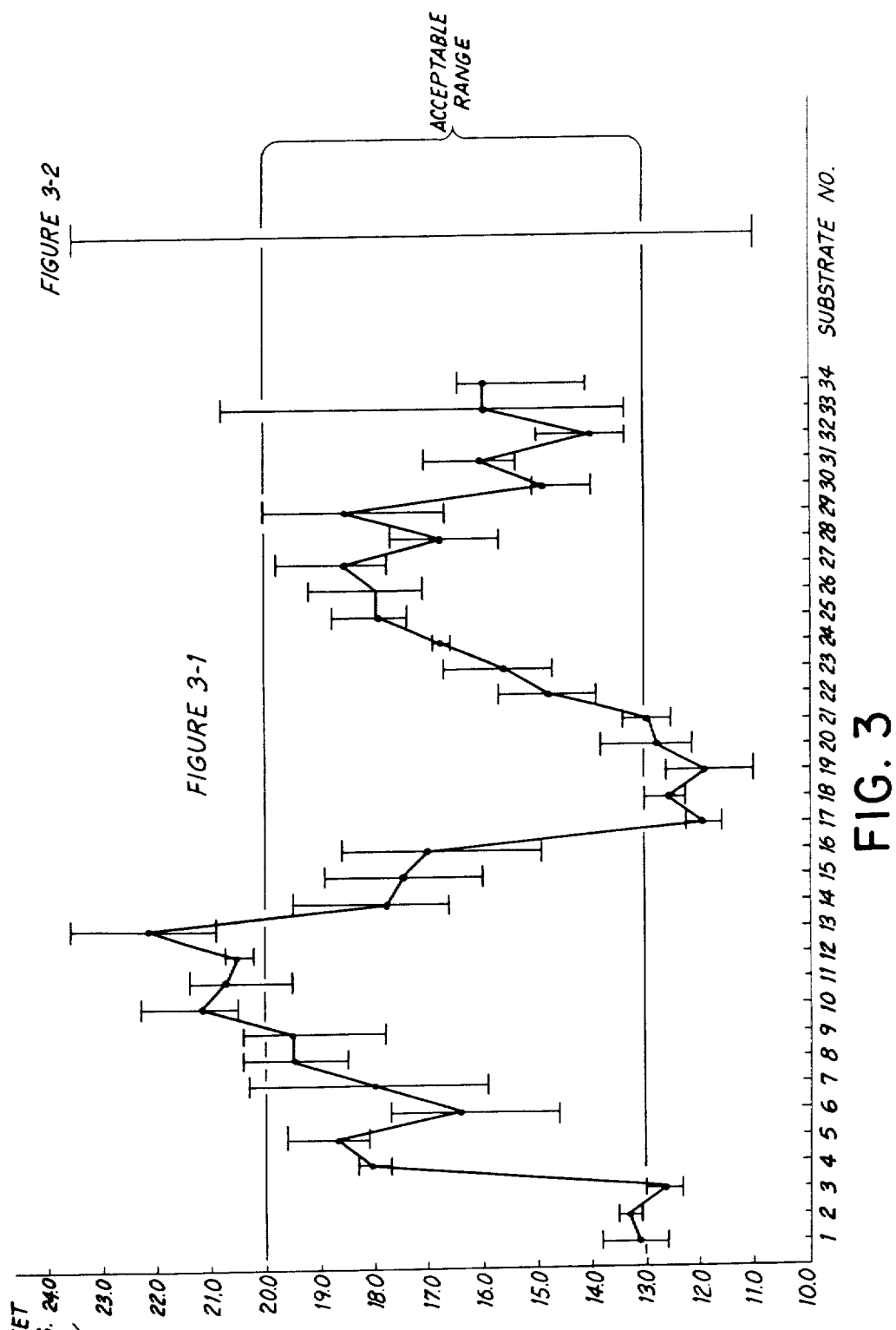
FIG. 3 is a graph of plating results obtained with the current control system of FIG. 2.

Referring now to FIGS. 1-3, those figures show a typical example of a gold plating process used in the manufacture of thin film integrated circuits and called "box plating." In this particular application of box plating (FIG. 1), the anodes (1) and the cathodes (2), are placed in parallel spaced relationship with a box-type electroplating cell (3). Generally, two cathodes (A,B), 3.75 inches by 4.5 inches circuit substrates, will face the opposite sides of an anode (C). The anode, a solid sheet of platinized titanium, is placed 0.25 inches from each cathode. The plating cell contains 17 anodes and 34 circuit substrates, 17 facing one direction, and 17 facing the opposite direction. The liquid electrolyte (4) is introduced into the bottom of the electroplating cell from the flow chamber (5). While an electropotential is being applied, the process requires that the electrolyte be forced between the cathodes and anodes, from which the gold is plated onto the selected areas of the cathodes. The applied electropotential across the 34 circuit substrates and inert anodes is controlled by two constant current power supplies (FIG. 2). Seventeen substrates (A's) facing one direction are connected in common to the one power supply (A). The 17 substrates (B's) facing the opposite direction are connected in common to the other constant current supply (B). All anodes (C's) are connected in common to both power supplies (A and B).

In this type of box plating process, nonuniformity of plated gold is encountered across any particular substrate and from one substrate to another within any plating cell group of 34. The nonuniformity causes defective circuits because of insufficient gold thickness in order to meet circuit design requirements. The variations in gold thickness cause process control difficulties in the physical manufacturing of the circuits. Because of the lack of uniformity, an excess of gold is plated onto the circuit substrates in order to achieve adequate gold thickness in sparsely plated areas. This results in the wasteful use of gold, a precious material.

The degree of nonuniformity from one substrate to another within a plating cell group of 34 substrates is dependent upon its position within the box plating cell. To illustrate this point, three groups of substrates identified one to 34 were placed into the plating cell in sequential order (FIG. 3). The three groups were plated while maintaining all physical and chemical parameters constant. The gold plated thicknesses were determined in units of sheet resistance, milli-ohms per square by measuring the center of each substrate with a four point probe. The total range of measurements at each location in the plating cell was graphed, the average of each range identified and the variations between each sequential position graphically displayed (FIG. 3-1). The total range of all center measurements (FIG. 3-2) pointed to the fact that 29.1 percent of the circuit substates were out of acceptable conductivity limits, 13 milli-ohms per square to 20 milli-ohms per square, for manufacturing circuits.

Figure 4:
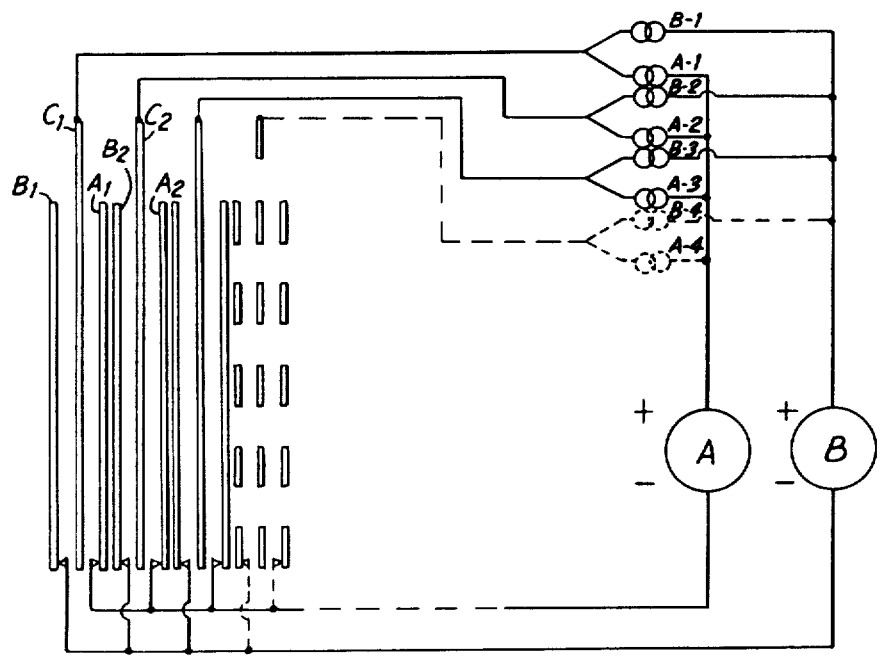
FIG. 4 is a schematic diagram of an improved electroplating current control system.

Since the variation was found to be consistent for each location in the plating cell, there was developed an independent constant current anode control system, the circuitry of which is shown in FIG. 4, and which is adapted to reduce and/or eliminate the variations in the gold thickness from one cathode substrate to the next. Each anode has two cathodes facing it, which cathodes respectively have two independent constant current anode controls in the form of current adjusting units (FIG. 4). The cathode $B_1$ connected to the power supply B has independent constant current control B-1, which controls the current to the B side of the anode C. The cathode $A_1$, facing the same anode C but on the opposite side, is connected to the power supply A, which has an independent anode control A-1 regulating the current to the A side of the anode C. The direct current sources A and B in FIG. 4 are adjustable constant voltage sources in the sense that while the current from each is adjustable by a control knob for the source, the voltage remains constant at its adjusted value despite variations in the current load on the source. Adjustable constant voltage sources A and B may each be a Sorensen Model SR-1050 d.c. power supply commercially available from the Sorensen Company, 676 Island Pond Road, Manchester, N.H. 03103. Under this arrangement, the current to each cathode group, $A_1$ and $B_1, \ldots A_n$ and $B_n$, respectively, per anode $C_1, \ldots, C_n$, respectively, is controlled by two independent controls for each anode. The 34 independent constant current controls and associated apparatus provide the anode control system. This control system is adapted to reduce the uniformity of variations of one substrate to the next. The independent constant current anode control module, which provides for the monitoring of the currents to the anodes, signals if the voltage is out of controllable limits and provides current control adjustment independent of other control modules is illustrated in detail in FIG. 5. While not preferred, each FIG. 5 module can be replaced by a potentiometer such as is discussed in the mentioned Raymond et al. patent. Adjusting each anode control reduces the thickness variations from one substrate to the next. To illustrate the effectiveness of the anode control system, three groups of substrates were identified one to 34 and placed into the box plating cell of the FIG. 1 apparatus as modified to incorporate the current control system of FIG. 4. All physical and chemical parameters were held constant during gold plating. The thickness of plated gold was determined in units of sheet resistance at the center of each plated substrate. The range of the sheet resistance at each location was graphed, the average of each range identified, and the variation is graphically displayed for each sequential cathode (FIG. 6-1). The total range of the center sheet resistances has been reduced (FIG. 6-2) when comparing it to the total sheet resistance range of the old method (FIG. 3-2). All measurements were within the acceptable range for circuit manufacturing.

Figure 7:
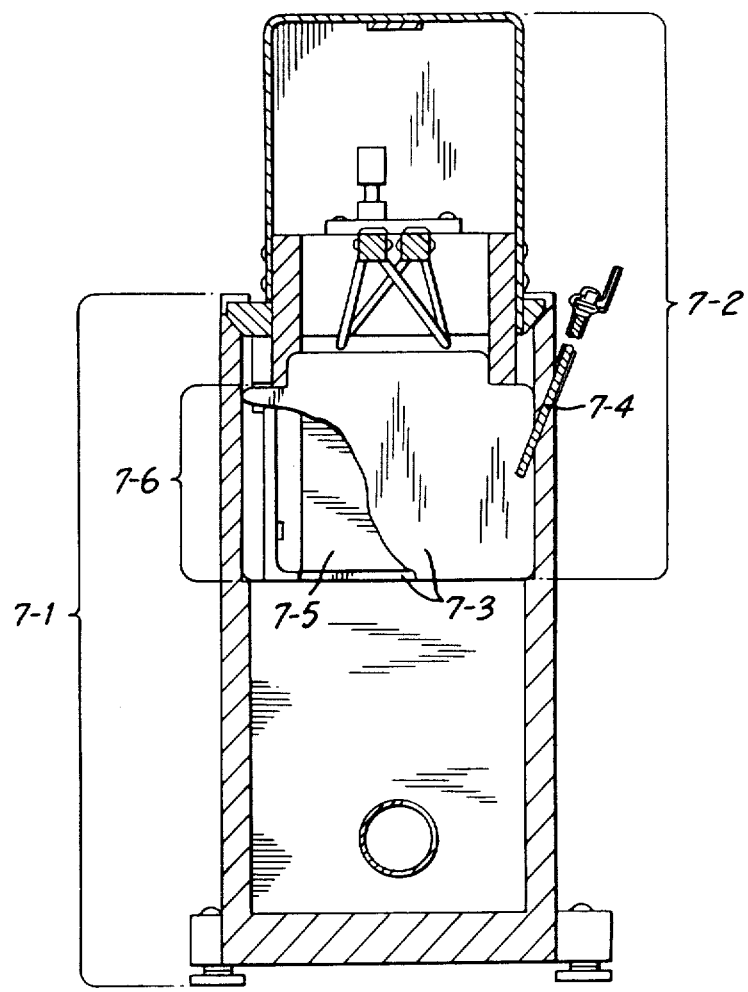
FIG. 7 is an end elevation in cross-section of the FIG. 1 apparatus as modified to incorporate a cathode carrying fixture for use with the FIG. 4 current control system.

To facilitate the use of the FIG. 4 anode control system, the FIG. 1 apparatus was improved by being modified as shown in FIG. 7. Referring to FIG. 7, the apparatus for the plating cell was divided into two complementary pieces, the anode control system flow chamber (7-1) and the cathode substrate carrying fixture (7-2). The anode control chamber, which contains permanently wired platinized titanium anodes (7-3) and hard wired connections (7-4) to the anode current controls reduce the number of anodes needed for the total number of manufacturing facilities.

The required compatibility with existing auxiliary equipment define the position of the substrate (7-5) to the anode (7-3). The substrate locking device (7-6) on the cathode substrate holder (7-2) provides a new method for positively securing the cathodes which are oriented in spaced relationship to the anodes within the plating cell by the holder (7-2).

Figure 8:
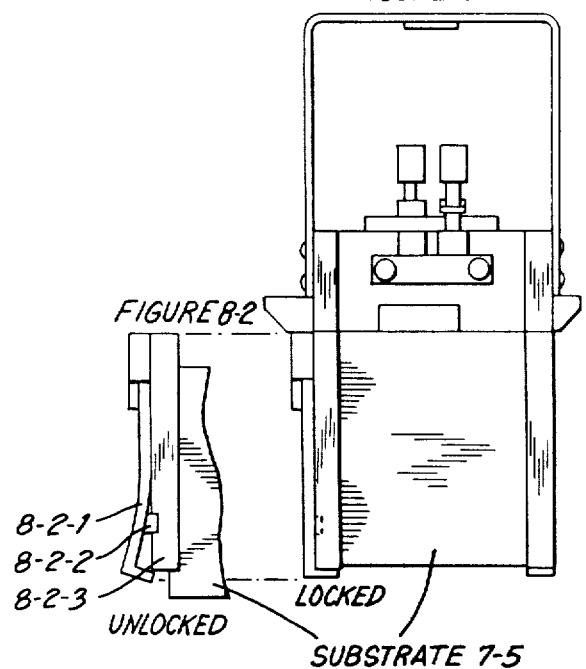
FIG. 8 is an end elevation of the fixture shown in cross-section in FIG. 7 as the top part of the apparatus shown therein.

The substrate holder (FIG. 8-1) is provided with a locking device (8-2) which consistently secures a back-to-back pair of substrates during plating. The device allows for the individual locking of the two substrates while allowing the placement of the substrates into substrate guides (8-2-3, 9-4) shown in FIGS. 8 and 9 such that most of the substrates will each be between two parallel anodes in the flow chamber (FIG. 7-1). The 17 pairs of the independently locked substrates can be removed at one time by removal of the cathode fixture from the cell 7-1. The removal at one time facilitates the loading and unloading of the substrate holder. For loading and unloading, the plastic locking springs (8-2-1, 9-1) are opened by inserting the plastic rod (8-2-2, 9-2). To lock all individual pairs of substrates (9-3) (7-5) into the fixture, the rod is removed (FIG. 8-1). The removal of the insertion rod allows for the substrate holder to be placed into the flow chamber.

Figure 9:
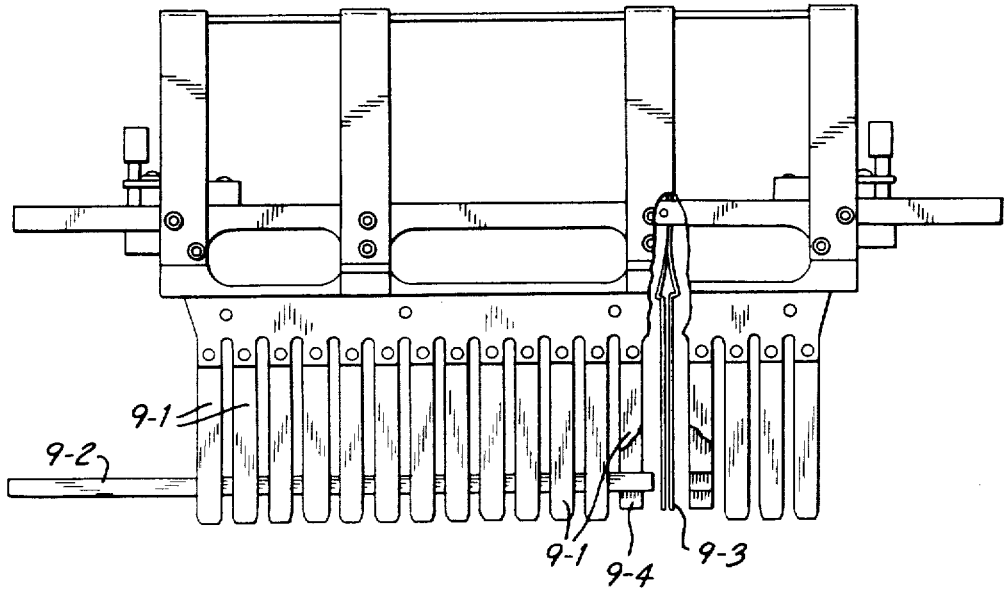
FIG. 9 is a front elevation of the fixture of FIG. 7.

To give further details of the apparatus of FIGS. 7–9, the substrate holder (FIG. 8-1) comprises a longitudinally elongated head which bridges transversely the anode containing chamber (FIG. 8-2) and fits on and over it like a lid. Secured to and extending vertically down from such head are a multiplicity of longitudinally spaced pairs of guides in the form of bars, and of which the guides in each such pair are transversely spaced. Each guide in each pair thereof has formed on its inner side a pair of longitudinally spaced vertical grooves registering with corresponding grooves in the other guide of such pair. Thus, each pair of guides by their grooves provide two guideways for, respectively, two cathode substrates which are advanced into such guideways from the free end of such pair of guides.

The guides in each of the two arrays on transversely opposite sides of the head have in their outer sides respective outward facing horizontally running notches which are aligned to form two longitudinally extending slide channels on the respective outer sides of the two arrays of guides for, respectively, the two spring displacing rods. Each such channel is less in transverse depth than the transverse width of the rod which in use is inserted therein, and the notches in the guides which provide such channels are sufficiently shallow so as to not cut into the vertical grooves on the inner sides of such guides. The rods which are inserted into such channels each has at its front end on its outer side a wedging face adapted by engaging the previously described plastic springs to force outwardly the forward part of the stems of such resilient springs.

The substrate holder is used as follows, assuming that to begin with it contains no substrates. The rods are forced into the mentioned channels to displace the springs adjacent that channel outward until the horizontally projecting tabs at the front ends of these springs clear (and then some) the openings of the mentioned vertical grooves in the associated array of guides which (openings) are at the free end of these guides. The holder is then turned upside down so that its head is at the bottom and its guides extend upwards. Next the various pair of substrates are loaded downward into the two guideways of the corresponding pairs of guides until downward movement of the substrates is stopped. The rods are then withdrawn from their channels to permit the plastic leaf springs to spring back to their original positions at which the horizontal tabs thereon close over the openings, at the free ends of the guides, of the vertical grooves therein. Thus the spring tabs lock into the two guideways in each pair of guides the two substrates loaded into these guideways. With the substrates being so locked in, the substrate holder is turned right side up and then placed over the top of the anode containing chamber.

The FIG. 4 current control system is connected with the FIGS. 7-9 apparatus as follows. Each of the anodes in the flow chamber 7-1 is hard wired to the two current adjusting units corresponding to that anode. Thus, for example, anode $C_1$ (FIG. 4) is hard wired to each of current adjusting units A-1 and B-1. The several "A" current adjusting units A-1 . . . A-N are hard wired to the positive side of the voltage source A, and the several "B" current-adjusting units B-1 . . . B-N are hard wired to the positive side of the voltage source B. The two voltage sources A,B and all of the current adjusting units are thus permanently associated with the flow chamber of cell 7-1. When the cathode carrying holder or head 7-2 is placed on the flow chamber 7-1, electrical connection is made from voltage source A to all of the cathodes $A_1$ . . . $A_n$ by a make-break contactor (not shown in FIG. 4) connected to the negative side of voltage source A between that source and the common conductor for such cathodes and, similarly, electrical connection is made from voltage source B to all of the cathodes $B_1$ . . . $B_n$ by a make-break contactor (not shown in FIG. 4) connected to the negative side of current source B between that source and the common conductor for the last-named cathodes. In the cathode holder 7-2, all of the cathodes $A_1$ . . . $A_n$ are ohmically connected together by what is shown in FIG. 4 as a common lead but what is, in fact, an electroconductive rod, and, similarly, all of cathodes $B_1$ . . . $B_n$ are ohmically connected together by an electroconductive rod. The two mentioned make-break contactors thus serve to connect all of the portions of the FIG. 4 circuit permanently associated with flow chamber 7-1 with all of the portions of such circuit permanently associated with the cathode carrying head 7-2 each time such head is placed in such flow chamber. Removal of the head from the chamber will of course break the circuit by opening up the respective contacts of each of such make-break contactors.

Because the total variation of the uniformity of the gold from one substrate to the next is reduced, the average thickness is reduced while maintaining all thicknesses within the acceptable range. The reduction of the nominal thickness has reduced the usage of gold on shipped product and in scrap.

The FIG. 4 control system provides the capability, due to the reduced variation, of plating even thinner coating of gold, while maintaining a small variation. The system, with the modifications of FIGS. 7-9, allows the same substrates to be processed through a number of different platings, copper to nickel to gold, using the respective anode material per plating bath. The FIG. 4 control system improves uniform each case.

The substrate locking device of FIGS. 7-9 provides for individually locking of each pair of substrates in a consistent position while allowing for the release of all 34 substrates at one time. The substrate holder with associated locking devices allows for the capability of multilayer plating, copper to nickel to gold, without removing the substrates from the holder.

It is recognized that placing the 34 current controls on the cathode side of the d.c. current sources instead of their anode side might facilitate better plating control. However, this would require 34 make-break connections each time the substrate holder is placed in the flow chamber versus the two connections required for anode current control. It has been the experience, however, that maintaining the integrity of make-break connections above a heated plating solution is a major problem which, however, is minimized by the use of only two make-break connections. The described FIG. 4 current control system and associated fixture of FIGS. 7-9 have provided separately and together an innovative approach to gold plating uniformity improvement.

Figure 5:
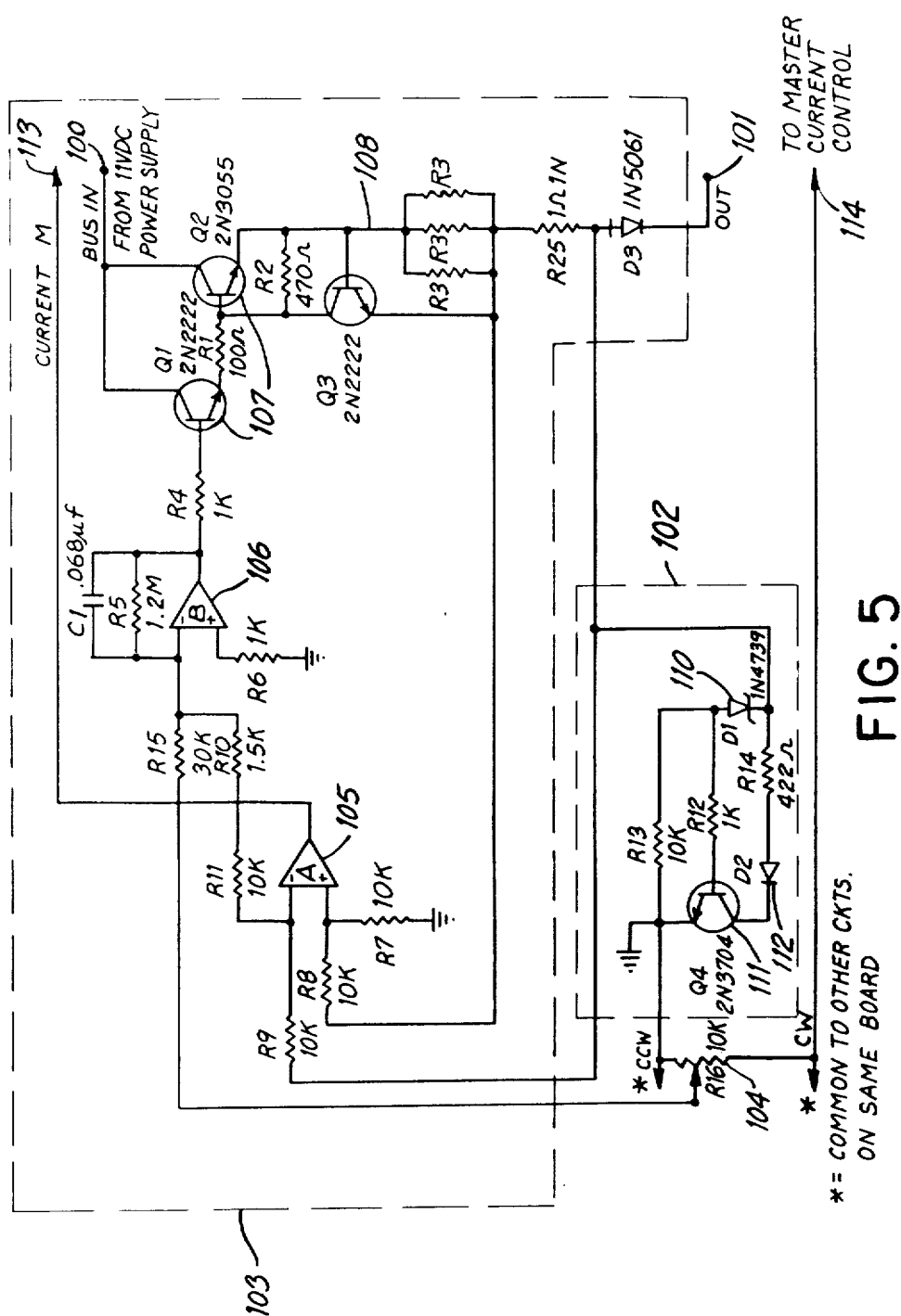
FIG. 5 is a schematic diagram of one of the current adjusting units shown in FIG. 4.
Figure 6:
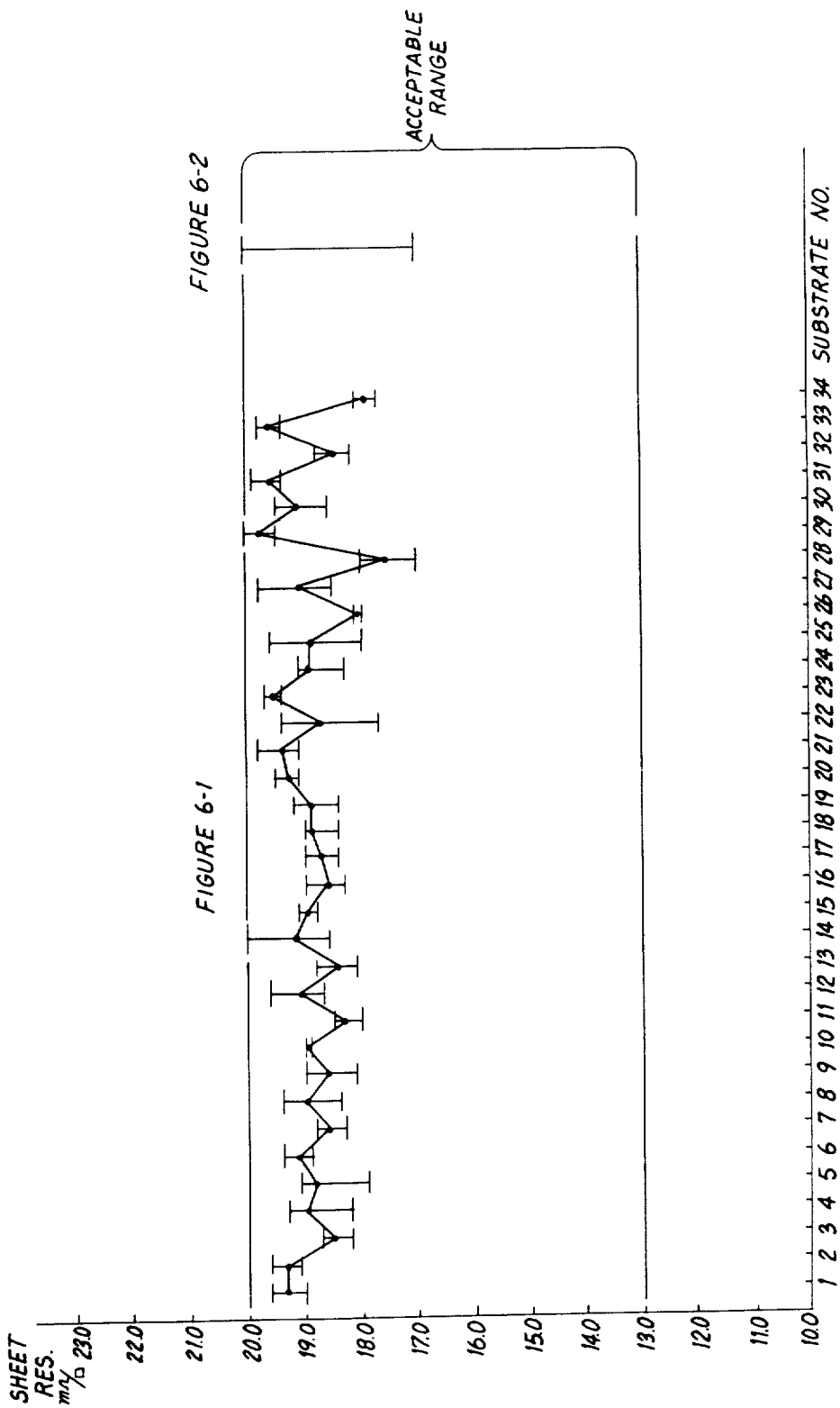
FIG. 6 is a graph of plating results obtained with the control system of FIG. 4.

Referring now to the details of FIG. 5, the constant current anode control circuitry which is shown in that figure, is electrically connected to the positive terminal of a ten volts power supply at the point 100. The anode control is electrically connected to the anode at the point 101.

The constant current anode control has two subcircuitries: (1) the alarm status subcircuit 102 and (2) the measurement and drive subcircuit 103. The alarm status subcircuit provides a visual signal when the measurement and drive subcircuit is beyond its controlling capabilities.

The measurement and drive subcircuit can provide a constant current to the plating circuit within the design capability. The variable resistor 104 is initially adjusted to provide a specified current to the anode. The plurality of anodes which are in spaced relationship within the plating cell must have the variable resistor of each anode control adjusted to achieve the desired plating on each cathode. The stray currents normally experienced in a prior art situation can be compensated by said adjustments.

Once the variable resistors are adjusted, the measurement and drive circuitry maintains a constant current supply. Resistance changes, contact resistance and solution resistance, will be sensed by the operational amplifier A (105). If the resistance increases in the plating cell, the operational amplifier A (105) cause the operational amplifier B (106) to produce a positive gain which will activate the transistor pair 107 thus maintaining a constant current in the line 108. The regulation of the current, constant current control, provides the cathode with the necessary current to maintain uniform plating. If the resistance of the plating cell becomes too high the zener voltage is reached activating the zener diode 110 which would activate the transistor 111. The activated transistor will cause the visual signal, LED 112, to light alerting the operator that the resistance in the line is beyond controllable limits.

The controller is also connected to a voltmeter at the point 113 which has a developed voltage proportional to the regulated current in order to monitor the current in the controller. The controller is connected at point 114 in common with other anode controllers so that a master control voltage may be used to ramp or control all the relative current of the independent controls at one time.

The above described embodiment being exemplary only, it will be understood that additions thereto, omissions therefrom and nodifications thereof can be made without departing from the spirit of the invention. Accordingly, the invention is not to be considered as limited save as is consonant with the recitals of the following claims.

What is claimed is:

1. Electroplating apparatus comprising, a cell for holding electrolyte, a plurality of anodes spaced from each other in said cell, a twice-as-large plurality of cathodes provided in said cell by articles to be plated and associated with said anodes in pairs wherein the first and second cathode in each pair are disposed in a spaced relation on opposite sides of an anode respective to that pair, first and second direct current sources of which the negative sides of said first and second sources are connected to, respectively, all of said first and second cathodes, a plurality of first current adjusting units respectively corresponding to said first cathodes and each connected on the positive side of said first source between said first source and the anode respective to said first cathode corresponding to that first unit, and a plurality of second current adjusting units respectively corresponding to said second cathodes and each connected on the positive side of said second source between said second source and the anode respective to said second cathode corresponding to that second unit.

2. Apparatus according to claim 1 in which the negative side of said first direct current source is ohmically connected to all such first cathodes so that they and said first current source on its negative side are all at substantially the same potential, and in which the negative side of said second direct current source is similarly ohmically connected to all such second cathodes so that they and said second current source on its negative side are all at substantially the same potential.

3. Apparatus according to claim 1 in which each of said first and second direct current sources is an adjustable constant voltage source adapted to maintain the voltage therefrom constant at its adjusted value despite impedance variation in the electrical load supplied with current by that source.

4. Electroplating apparatus comprising a cell for holding an electrolyte, a plurality of anodes speced from each other in said cell, a corresponding plurality of cathodes provided in said cell by articles to be plated, and each spaced in said cell from the corresponding anode to be paired therewith, and an adjustable constant voltage direct current source adapted to maintain its voltage at the value to which adjusted despite impedance variation in the electrical load on that source, such source being connected on, respectively, its positive and negative sides with, respectively, all such anodes and all such cathodes so that there is a separate path for each anode-cathode pair for current supplied by said source, and a plurality of current adjusting units each corresponding to an anode-cathode pair and all connected with said adjustable current source on the positive side thereof so that each unit is connected in the separate current path for the corresponding anode-cathode pair, each such current adjusting unit being operable to adjust the current in the mentioned path in which such unit is connected.

5. Electroplating apparatus comprising, a cell for holding an electrolyte, a plurality of anodes spaced from each other in said cell, a respectively corresponding plurality of cathodes provided in said cell by articles to be plated, and each spaced in said cell from the corresponding anode to be paired therewith, a source of direct current connected on its positive and negative sides with, respectively all such anodes and all such cathodes so that there is a separate path for each anode-cathode pair for current supplied by said source, and a plurality of adjustable constant current units each corresponding to an anode-cathode pair and each connected to one side of said source in the separate current path for such anode-cathode pair, each such adjustable constant current unit being operable to adjust the current therethrough to a selected value over a range of such values and, within that range, to maintain such current constant at such selected value without readjustment of such unit despite impedance variation in the mentioned path in which such unit is connected.

6. Apparatus according to claim 5 in which each adjustable constant current unit includes alarm circuitry for producing an alarm indication when the current through such unit exceeds a predetermined value.

7. Apparatus according to claim 5 in which said direct current source is an adjustable constant voltage source adapted to maintain its voltage at the value to which adjusted despite impedance variation in the electrical load supplied with current by that source.

* * * * *